United States Patent
Gambino et al.

(10) Patent No.: US 7,227,230 B2
(45) Date of Patent: Jun. 5, 2007

(54) LOW-K GATE SPACERS BY FLUORINE IMPLANTATION

(75) Inventors: Jeffrey P. Gambino, Westford, VT (US); Jack Mandelman, Flatrock, NC (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 71 days.

(21) Appl. No.: 10/775,440

(22) Filed: Feb. 10, 2004

(65) Prior Publication Data

US 2004/0171201 A1   Sep. 2, 2004

Related U.S. Application Data

(62) Division of application No. 10/345,344, filed on Jan. 15, 2003, now Pat. No. 6,720,213.

(51) Int. Cl.
  H01L 29/76   (2006.01)
  H01L 29/94   (2006.01)
  H01L 31/062  (2006.01)
  H01L 31/113  (2006.01)
  H01L 31/119  (2006.01)

(52) U.S. Cl. .................. 257/369; 257/900

(58) Field of Classification Search .......... 257/645, 257/651, 900, 337–338, 368–369
See application file for complete search history.

(56) References Cited

U.S. PATENT DOCUMENTS

| | | | |
|---|---|---|---|
| 5,571,734 A | 11/1996 | Tseng et al. | |
| 5,599,726 A * | 2/1997 | Pan | 438/304 |
| 5,677,218 A | 10/1997 | Tseng | |
| 5,793,088 A | 8/1998 | Choi et al. | |
| 5,872,382 A | 2/1999 | Schwalke et al. | |
| 5,973,371 A * | 10/1999 | Kasai | 257/382 |
| 6,255,703 B1 | 7/2001 | Hause et al. | |
| 6,285,054 B1 | 9/2001 | Liu et al. | |
| 6,297,106 B1 | 10/2001 | Pan et al. | |
| 6,358,826 B1 | 3/2002 | Hause et al. | |
| 6,420,220 B1 | 7/2002 | Gardner et al. | |
| 6,482,726 B1 * | 11/2002 | Aminpur et al. | 438/585 |
| 6,555,892 B2 * | 4/2003 | Horstmann et al. | 257/508 |
| 6,639,264 B1 * | 10/2003 | Loh | 257/301 |
| 6,762,086 B2 * | 7/2004 | Oh | 438/199 |
| 2003/0038305 A1 * | 2/2003 | Wasshuber | 257/213 |

FOREIGN PATENT DOCUMENTS

JP   2000260989   9/2000

* cited by examiner

*Primary Examiner*—Hoai Pham
(74) *Attorney, Agent, or Firm*—Scully, Scott, Murphy & Presser, P.C.; Joseph P. Abate, Esq.

(57) ABSTRACT

A MOSFET device and a method of fabricating a MOSFET device having low-K dielectric oxide gate sidewall spacers produced by fluorine implantation. The present invention implants fluorine into the gate oxide sidewall spacers which is used to alter the properties of advanced composite gate dielectrics e.g. nitridized oxides, NO, and gate sidewall dielectrics, such that the low-K properties of fluorine are used to develop low parasitic capacitance MOSFETs.

5 Claims, 4 Drawing Sheets

LOW-K GATE SPACERS BY FLUORINE IMPLANTATION

CROSS REFERENCE TO RELATED APPLICATION

The present application is a divisional of U.S. patent application Ser. No. 10/345,344, filed on Jan. 15, 2003 now U.S. Pat. No. 6,720,213.

BACKGROUND OF THE INVENTION

The present invention relates generally to the provision of low-K (reduced from 4.0 to approximately 3.3) gate sidewall spacers by fluorine implantation in a MOSFET device, and more particularly pertains to a MOSFET structure, and a method of fabrication thereof, having fluorine doped gate oxide sidewall spacers, such that the low-K properties of fluorine are used to develop low parasitic capacitance MOSFETs Device feature scaling has associated fundamental problems which tend to degrade overall power dissipation including:

increased stud or via capacitance as a result of sidewall spacer thickness reduction;

increased overlap capacitance as a result of gate dielectric thickness scaling;

increased GIDL (gate-induced drain leakage) current as a result of a thinner gate dielectric in the gate-to-diffusion overlap region;

degraded dielectric breakdown at the gate edge.

SUMMARY OF THE INVENTION

The present invention provides a MOSFET device and a method of fabricating a MOSFET device having low-K dielectric gate oxide sidewall spacers formed by fluorine implantation. The present invention reduces the dielectric constant from approximately 4.0 to approximately 3.3, or to a value somewhere in the range between 3.3 and 4.0. The present invention implants fluorine into the gate oxide sidewall spacers which is used to alter the properties of advanced composite gate dielectrics e.g. nitridized oxides, NO, and gate sidewall dielectrics, such that the low-K properties of fluorine are used to develop low parasitic capacitance MOSFETs.

The low-K dielectric gate sidewall spacers result in reduced capacitance through the gate sidewall spacer. By appropriate selection of the fluorine implant dosage and energy, the dielectric constant of the gate dielectric in the gate-to-diffusion overlap region is also reduced, thereby reducing the overlap capacitance and the GIDL field in the Si at the drain diffusion. Furthermore, the reliability of the gate dielectric, particularly at the corner, is improved by the presence of the fluorine.

The present invention provides implantation of fluorine into the oxide spacers on the sidewalls of the gate conductors and provides a sacrificial protective layer over the substrate to block fluorine implantation into the substrate, and also provide an etch stop barrier to allow the removal of the sacrificial blocking layer without damaging the fluorinated spacers.

BRIEF DESCRIPTION OF THE DRAWINGS

The foregoing objects and advantages of the present invention for the provision of low-K gate spacers by fluorine implantation may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION OF THE INVENTION

Figure 1:
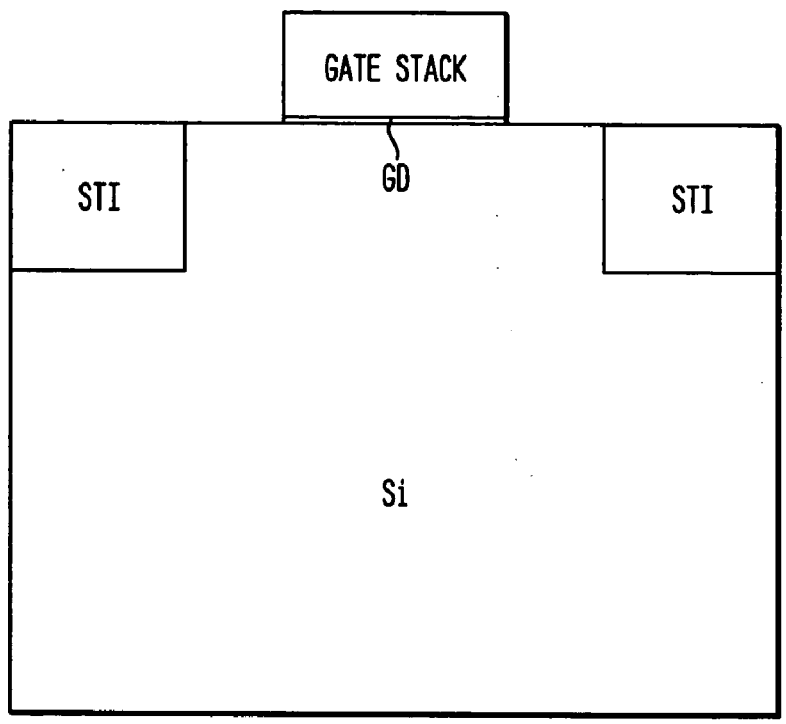
FIG. 1 illustrates a device fabricated on a silicon substrate having shallow trench isolation STI and a gate stack, wherein following STI formation, wells are implanted, a gate dielectric GD is formed, and the gate stack is deposited and patterned.

The present invention implants fluorine into the oxide spacers on the sidewalls of the gate conductors of a MOSFET device which is used to alter the properties of advanced composite gate dielectrics e.g. nitridized oxides, NO, and gate sidewall dielectrics.

The present invention reduces the dielectric constant from approximately 4.0 to approximately 3.3, or to a. value somewhere in the range between 3.3 and just below 4.0, depending upon the desired dielectric properties and the selected implant dosage and implant energy.

The low-K properties of fluorine are used to develop low parasitic capacitance MOSFETs. Additionally, these MOSFETs exhibit improved short channel properties.

In a first embodiment, standard gate sidewall CVD oxide spacers are formed by CVD (chemical vapor deposition) and RIE (reactive ion etching), and then a thin silicon nitride etch stop barrier and an HDP (high density plasma) oxide layer are deposited. The HDP oxide deposits primarily on the horizontal surfaces. Then an angled (10 to 90 degrees with 45 degrees being preferred) fluorine implant is performed into the spacers. The angled fluorine implant penetrates the thin nitride layer and is deposited into the thick oxide spacers.

The fluorine is used to lower the dielectric constant of the spacers, thus reducing the gate to stud capacitance and the gate to diffusion capacitance. In this embodiment, the fluorine only penetrates the spacer, not the gate dielectric. Since the fluorine diffuses rapidly into the spacers and more slowly in a nitridized gate oxide, the dielectric constant of the gate sidewall spacers increases the Teff (effective thickness) of the gate insulator over the channel region, without degrading the characteristics of the MOSFET (sub-Vt slope (the slope of the current vs. voltage curve below the threshold voltage), Isat (the saturation/maximum current)).

Only the portion of the gate insulators over the S/D (source/drain) diffusions is implanted with fluorine. Therefore, both the outerfringe and overlap gate capacitances are decreased. Also note that this embodiment can incorporate a high dielectric constant material, such as SiN, $ZrO_2$, and $HfO_2$.

One advantage of incorporating fluorine into and near the drain junction edge is an increased resistance to hot-electron degradation. Fluorine in the gate oxide produces a more hot-electron resistant interface. By limiting fluorine implantation to the source-drain edges, and avoiding the remainder of the channel, hot-carrier immunity is increased without degrading the effective thickness of the gate oxide.

Another advantage of introducing fluorine into the gate overlap region is improved gate oxide integrity. The deleterious effect of electric field enhancement at the gate conductor corner on oxide breakdown is mitigated by the improved gate oxide integrity resulting from fluorine in that region.

The HDP oxide layer blocks the fluorine from the source/drain regions of the silicon substrate. The thin nitride layer also provides a barrier to diffusion of fluorine through the HDP oxide and into the Si substrate. Further the nitride layer provides an etch stop barrier, allowing the removal of the HDP oxide material from the fluorinated oxide spacers.

In a second embodiment, the F implant dosage and energy range (F dosage range=1E14 to 2E16 cm-2 with 2E15 cm-2 being preferred, implant energy=5 to 100 keV with 50 keV being preferred) is precisely set to influence the junction/contact region. This will locally alter the gate dielectric characteristic, increasing the threshold voltage of the device. This technique reduces the halo dose requirement, and will also decrease the perimeter capacitance of the device. The penalty for this action is an increase in sub-threshold swing, but this can be compensated by adjusting the threshold voltage.

Another benefit of this method (over a bird's beak for example) is reduced stress and reduced dislocations in the silicon, which minimizes junction leakage currents. Such a device design is favorable for a DRAM transfer device.

For both device descriptions discussed, the gate electric field is reduced in the silicon, and the GIDL junction leakage current is also reduced.

FIG. 1 illustrates a device fabricated on a silicon substrate having shallow trench isolation STI and a gate stack. Following shallow trench isolation STI formation, wells are implanted according to standard processing. A gate dielectric GD is formed, and the gate stack is deposited and patterned.

Figure 2:
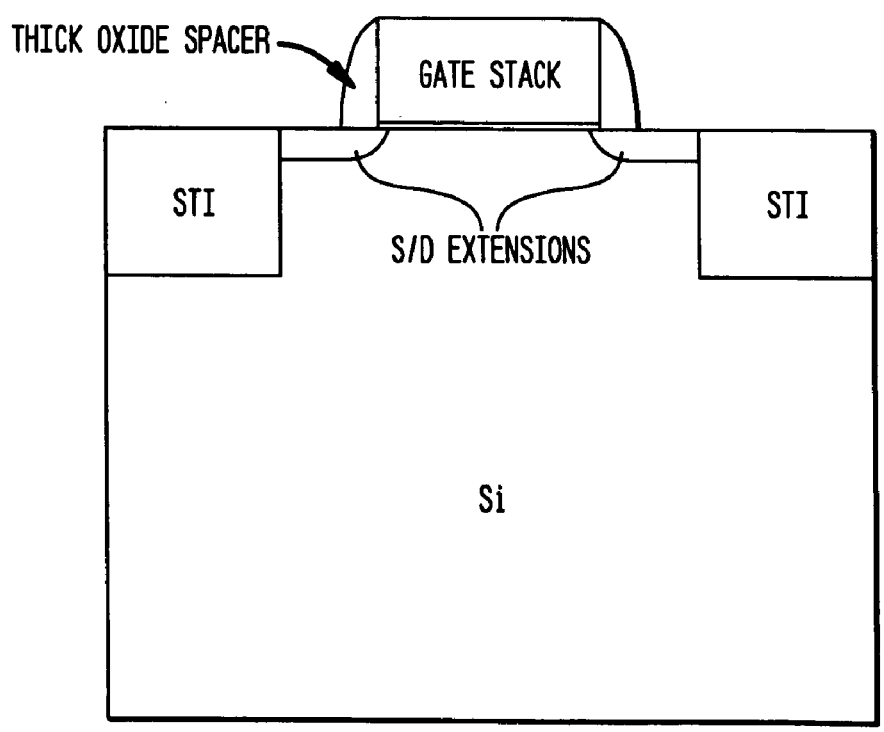
FIG. 2 illustrates the device after gate sidewall oxidation is performed, wherein the S/D extensions are implanted, and then the thick oxide spacers are formed, typically by the deposition of a CVD (chemical vapor deposition) oxide followed by an oxide RIE (reactive ion etch).

FIG. 2 illustrates the device after gate sidewall oxidation is performed. The S/D extensions are implanted, and then the thick oxide spacers are formed, typically by the deposition of a CVD (chemical vapor deposition) oxide followed by an oxide RIE (reactive-ion etch).

Figure 3:
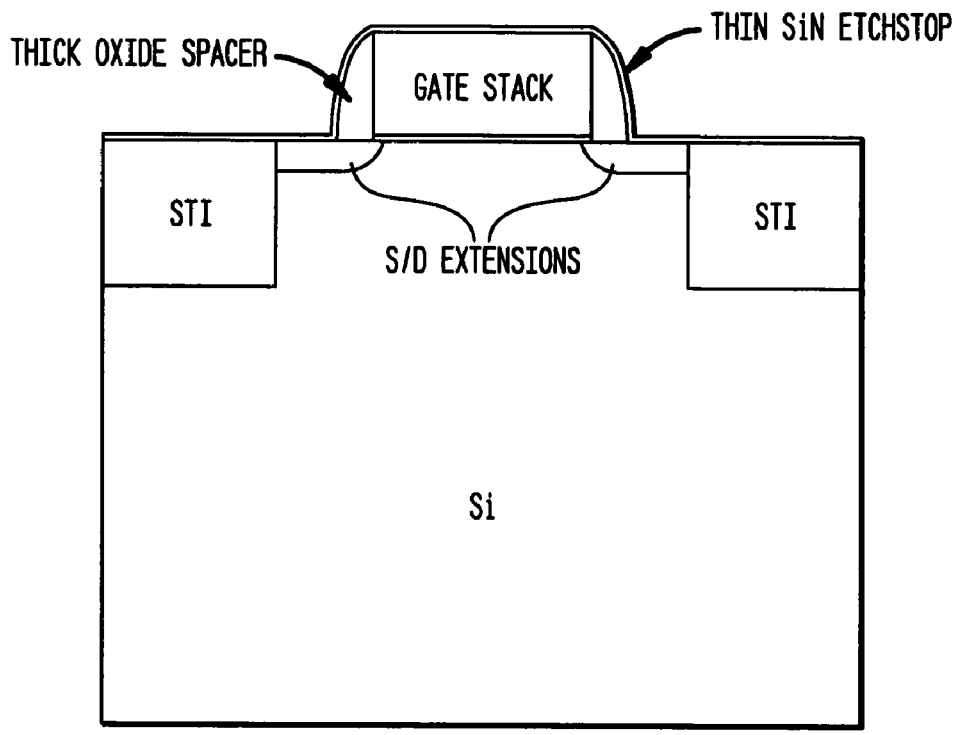
FIG. 3 illustrates the device after a thin silicon nitride layer is conformally formed over the structure, preferably by CVD nitride deposition using well known methods.

FIG. 3 illustrates the device after a thin silicon nitride layer is conformally formed over the structure, preferably by CVD nitride deposition using well known methods.

Figure 4:
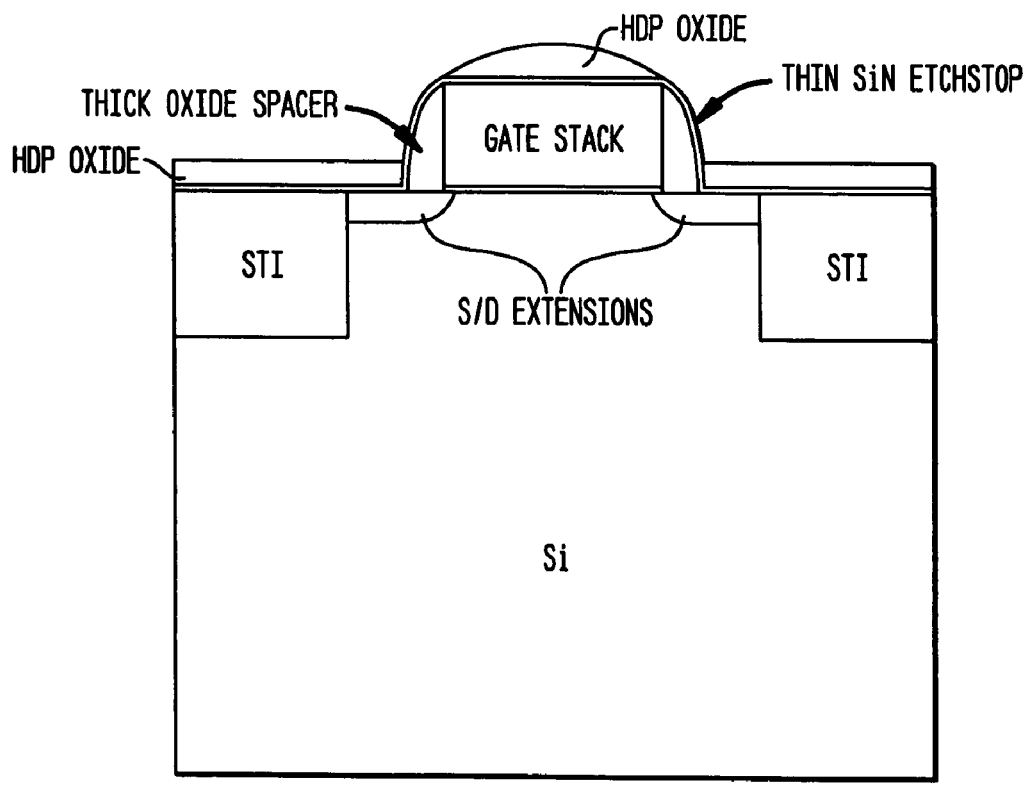
FIG. 4 illustrates the device after an HDP (high density plasma) oxide layer is deposited primarily on the horizontal surfaces, and is used to protect the substrate from a subsequent fluorine implant.

FIG. 4 illustrates the device after an HDP oxide layer is deposited. The HDP oxide is deposited primarily on the horizontal surfaces, and is used to protect the substrate from a subsequent fluorine implant.

Figure 5:
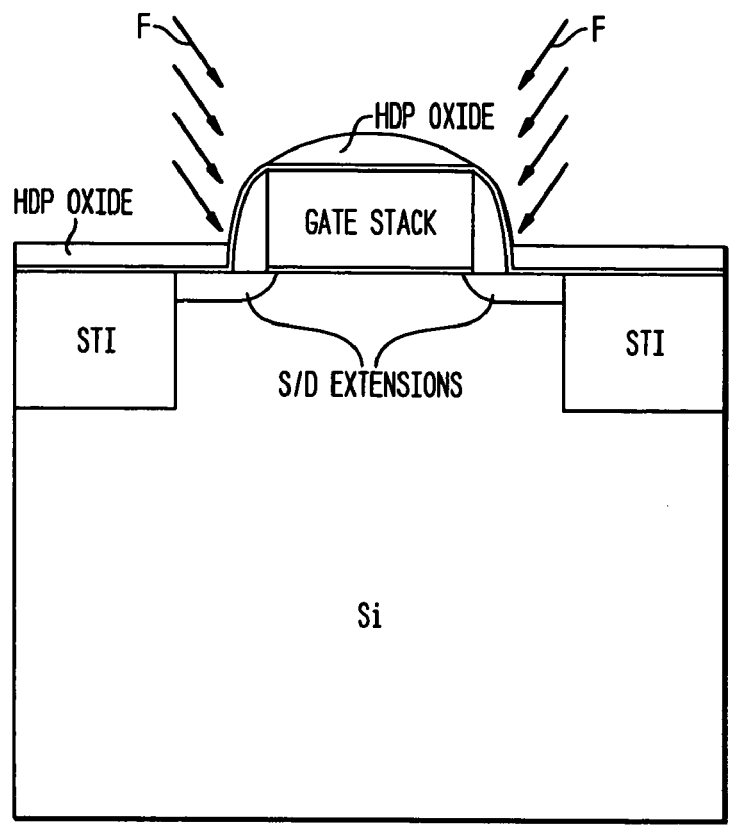
FIG. 5 shows an angled fluorine implant being performed through the thin nitride layer and into the thick oxide spacers to form the low-K fluorine doped side gate oxide spacers.

FIG. 5 shows an angled (10 to 90 degrees, with 45 degrees being preferred, relative to an upper horizontal surface of a wafer containing the MOSFET device) fluorine implant being performed through the thin nitride layer and into the thick oxide spacers to form the low-K side spacers. The implant energy is selected such that a negligible amount of fluorine reaches the Si substrate.

Figure 6:
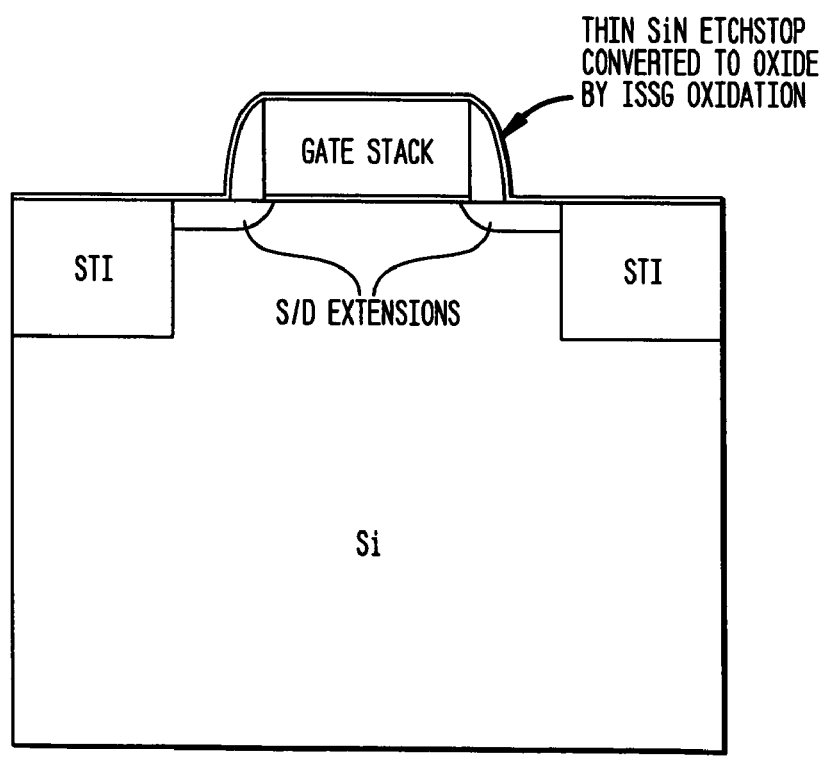
FIG. 6 shows the HDP oxide stripped selective to the SiN etch stop layer, after which an ISSG (in-situ steam generation) oxidation process is used to convert the thin SiN etch stop to oxide, to be consistent with a low-K spacer objective.

FIG. 6 shows that the HDP oxide is stripped selective to the SiN etch stop layer. Then an ISSG (in-situ steam generation) oxidation process is used to convert the thin SiN etch stop to oxide, to be consistent with a low-K spacer objective.

ISSG is an oxidation process that may be used to convert nitride to oxide. The reaction equations for the oxidation of Si are:

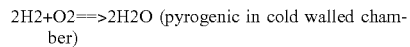

2H2+O2==>2H2O (pyrogenic in cold walled chamber)

Si+2H2O=->SiO2+2H2 (wafer heated by IR)

The process is usually performed at less than 20 Torr. For conversion of oxide to nitride, substitute Si3N4 for the Si in the second equation. ISSG may also be used with remote plasma nitridation (RPN) and reoxidation of silicon nitride in a vertical high pressure (VHP) furnace.

Figure 7:
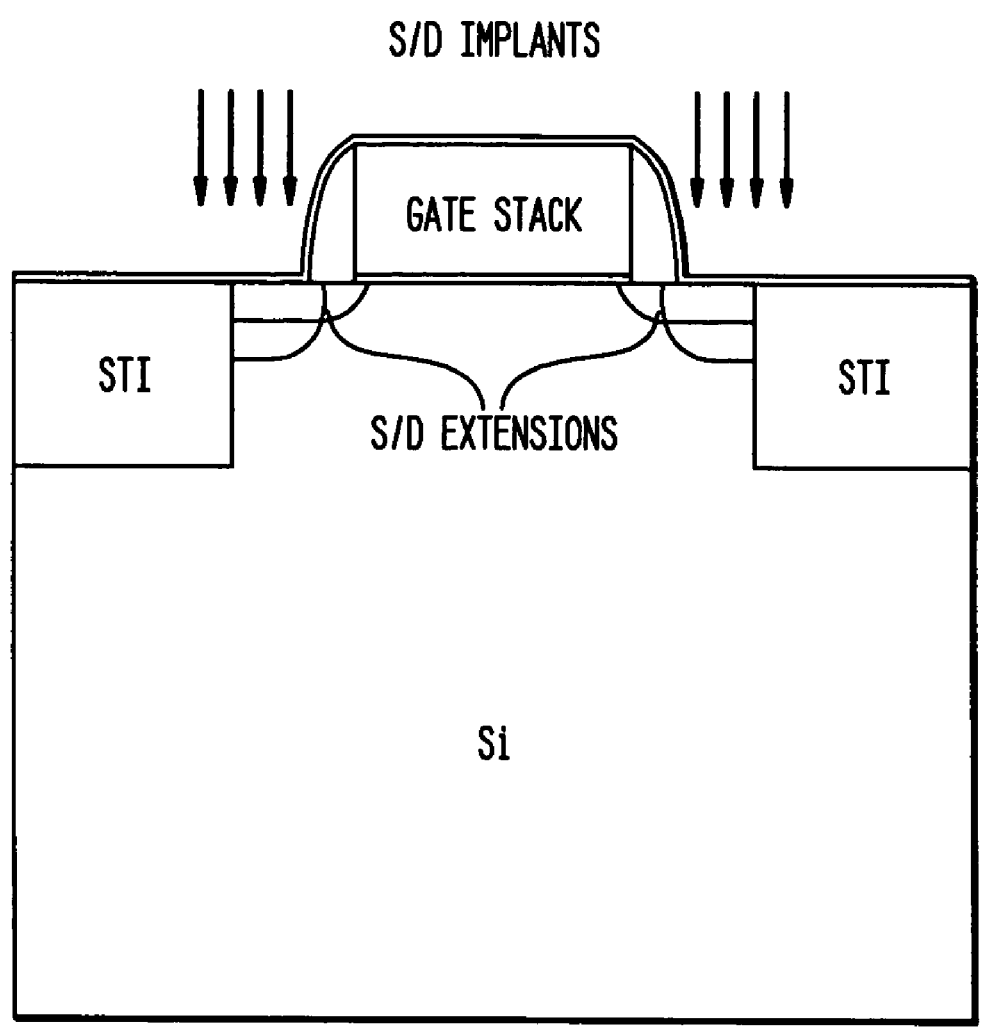
FIG. 7 illustrates the device after standard S/D (source/drain) contact implants are done, after which normal processing resumes to the completion of the chip.

FIG. 7 illustrates the device after standard S/D contact implants are done, and then normal processing resumes to the completion of the chip.

The present invention provides a MOSFET device and a method of fabricating a MOSFET device having low-K dielectric gate oxide sidewall spacers on the sidewalls of the gate conductors formed by fluorine implantation which is used to alter the properties of advanced composite gate dielectrics e.g. nitridized oxides, NO, and gate sidewall dielectrics, such that the low-K properties of fluorine are used to develop low parasitic capacitance MOSFETs.

The low-K dielectric gate sidewall spacers result in reduced capacitance through the gate sidewall spacer. By appropriate selection of the fluorine implant dosage and energy (F dosage range=1E14 to 2E16 cm-2 with 2E15 cm-2 being preferred, implant energy=5 to 100 keV with 20 keV being preferred), the dielectric constant of the gate dielectric in the gate-to-diffusion overlap region is also reduced, thereby reducing the overlap capacitance and the GIDL field in the Si at the drain diffusion. Furthermore, the reliability of the gate dielectric, particularly at the corner, is improved by the presence of the fluorine.

A sacrificial protective layer is provided over the substrate to block fluorine implantation into the substrate, and also an etch stop barrier is provided to allow the removal of the sacrificial blocking layer without damaging the fluorinated sidewall spacers.

The MOSFET device is fabricated on a silicon substrate by forming shallow trench isolation STI, implanting wells, forming a gate dielectric, and depositing and patterning a gate stack, implanting S/D extensions and forming thick oxide gate sidewall spacers.

A thin silicon nitride etch stop layer is then formed and deposited by chemical vapor deposition on the fabricated structure.

An oxide layer is deposited on the surfaces of the fabricated structure to protect the substrate from a subsequent fluorine implant. The oxide layer is deposited primarily on the horizontal surfaces of the fabricated structure.

Then, fluorine is implanted through the thin silicon nitride etch stop layer and into the thick oxide gate sidewall spacers to form the low-K fluorine doped thick oxide gate sidewall spacers. The fluorine implant penetrates the gate sidewall spacers, not the gate dielectric. The fluorine implant range influences a junction/contact region of the MOSFET device to locally alter the gate dielectric characteristic, increasing the threshold of the device.

This is followed by stripping of the oxide layer selective to the silicon nitride etch stop layer.

The silicon nitride layer is then oxidized to convert the silicon nitride etch stop to an oxide. The step of oxidizing the silicon nitride layer is preferably performed with an ISSG oxidation process.

The fabrication process produces a MOSFET device having fluorine doped low K dielectric oxide gate sidewall spacers, such that the low-K properties of fluorine are used to develop a low parasitic capacitance MOSFET. The MOSFET device comprises a silicon substrate having shallow trench isolation STI, implanted wells, a gate dielectric, a deposited and patterned gate stack, implanted S/D extensions and thick oxide gate sidewall spacers which are implanted with fluorine to form low-K fluorine doped thick oxide gate sidewall spacers. The fabrication process results in a silicon nitride oxide layer being formed over the MOSFET device.

The present invention provides implantation of fluorine into the oxide spacers on the sidewalls of the gate conductors and provides a sacrificial protective layer over the substrate to block fluorine implantation into the substrate, and also provides an etch stop barrier to allow the removal of the sacrificial blocking layer without damaging the fluorinated spacers.

While several embodiments and variations of the present invention for the provision of low-K gate spacers by fluorine implantation are described in detail herein, it should be apparent that the disclosure and teachings of the present invention will suggest many alternative designs to those skilled in the art.

We claim:

1. A MOSFET device comprising a silicon substrate having shallow trench isolation STI and source and drain regions located therein, a gate dielectric and a gate stack located on said silicon substrate between the source and drain regions, and a fluorine doped low K dielectric oxide gate spacer located on sidewalk of said gate stack, said fluorine doped low K dielectric oxide gate spacer having a fluorine content of about 1E14 to 2E16 $cm^{-2}$, wherein said fluorine doped low K dielectric oxide gate spacer is in direct contact with an overlying silicon nitride oxide layer and at least a portion of said source and drain regions directly contacts said silicon nitride oxide layer.

2. The MOSFET device of claim 1 wherein said fluorine doped low K dielectric oxide gate spacer has a dielectric constant value in a range of 3.3 to 4.0.

3. The MOSFET device of claim 1 wherein said fluorine doped low K dielectric oxide gate spacer has a dielectric constant value of substantially 3.3.

4. The MOSFET device of claim 1 wherein said silicon nitride oxide layer overlays said gate stack.

5. A MOSFET device comprising a silicon substrate having shallow trench isolation (STI) located therein, a gate dielectric and a gate stack located on said silicon substrate, a fluorine doped low K dielectric oxide gate spacer located on sidewalls of said gate stack, and a silicon nitride oxide layer overlaying and contacting said gate stack, said fluorine doped low K dielectric oxide gate spacer, and remaining surfaces of the silicon substrate, wherein no material with a dielectric constant greater than 4.0 is present between said fluorine doped low K dielectric oxide gate spacer and said silicon nitride oxide layer.

\* \* \* \* \*